(12) United States Patent
Wu et al.

(10) Patent No.: US 10,699,631 B2
(45) Date of Patent: Jun. 30, 2020

(54) LED SENSING SYSTEM AND DISPLAY PANEL SENSING SYSTEM

(71) Applicant: Prilit Optronics, Inc., Tainan (TW)

(72) Inventors: Biing-Seng Wu, Tainan (TW); Fa-Ming Chen, Tainan (TW)

(73) Assignee: Prilit Optronics, Inc., Tainan (TW)

( * ) Notice: Subject to any disclaimer, the term of this patent is extended or adjusted under 35 U.S.C. 154(b) by 0 days.

(21) Appl. No.: 16/129,112

(22) Filed: Sep. 12, 2018

(65) Prior Publication Data

US 2020/0082751 A1  Mar. 12, 2020

(51) Int. Cl.
*G09G 3/32* (2016.01)
*H05B 33/08* (2020.01)
*H05B 45/00* (2020.01)

(52) U.S. Cl.
CPC ............... *G09G 3/32* (2013.01); *H05B 45/00* (2020.01); *G09G 2310/0264* (2013.01)

(58) Field of Classification Search
CPC ...... G09G 3/2018; G09G 3/2003; G09G 3/32; G09G 2310/08; G09G 2320/02; G09G 5/04; G09G 3/3275; G09G 3/3208; G09G 2320/0276; G09G 2320/0242; G09G 2310/0294; G09G 2310/0286; G09G 5/06
See application file for complete search history.

(56) References Cited

U.S. PATENT DOCUMENTS

| | | | |
|---|---|---|---|
| 6,545,652 B1* | 4/2003 | Tsuji | G09G 3/32 315/169.1 |
| 2011/0285325 A1* | 11/2011 | Jheng | H05B 33/0845 315/312 |
| 2012/0007898 A1* | 1/2012 | Pavicic | G09G 3/2088 345/690 |

* cited by examiner

*Primary Examiner* — Md Saiful A Siddiqui
(74) *Attorney, Agent, or Firm* — Muncy, Giessler, Olds & Lowe, P.C.

(57) ABSTRACT

A LED sensing system and a display panel sensing system are disclosed. The LED sensing system comprises LEDs and a driver. The LEDs are arranged in a LED array, and the driver is disposed on a central portion of the LED array and electrically connected to the LEDs respectively. The driver can receive an activation maintenance signal, and receive an input address, and turn on one of the LEDs corresponding to the input address, so as to obtain a magnitude of a voltage of the LED corresponding to the input address for determining performance of the LED and a yield rate of the LED array.

14 Claims, 6 Drawing Sheets

LED SENSING SYSTEM AND DISPLAY PANEL SENSING SYSTEM

BACKGROUND OF THE INVENTION

1. Field of the Invention

The present invention generally relates to a sensing system, more particularly to a LED sensing system in which a driver is disposed at the central portion of a LED array and receives an input address to turn on the LED of the LED array corresponding to the input address, so as to determine performance of the LED.

2. Description of the Related Art

In recent years, the demand for display is increasing gradually, and requirements for display quality is also increasing, so the light source quality of the display becomes a very important issue. Nowadays, the light source of the displayer has gradually changed from fluorescent tubes to light-emitting diodes. With a high light-emitting efficiency and a long life, so the light-emitting diode has been widely used by display manufacturers. Therefore, the quality of the light-emitting diode plays an important role in screen quality of the monitor.

The light source of the display on the market is a light-emitting diode array composed of light-emitting diodes, and a driving circuit and a scanning circuit are respectively disposed on the row side and the column side of the light-emitting diode array and configured to inspect the performance of the light-emitting diodes. However, the driving circuit is disposed on the side of the light-emitting diode, so the sensing speed for the light-emitting diode near the driving circuit is fast, and the sensing speed of the light-emitting diode away from the drive circuit is slow, and it cause errors in the sensing process of the light-emitting diode.

Therefore, what is needed is to develop a LED sensing system to solve the conventional problem.

SUMMARY OF THE INVENTION

In order to solve the conventional problems, the present invention provides a LED sensing system and a display panel sensing system.

According to an embodiment, the present invention provides a LED sensing system, comprising a plurality of LEDs and a driver. The LEDs are arranged in a LED array by an array form. The driver is disposed at a central portion of the LED array and electrically connected to the plurality of LEDs, respectively, and the driver comprises an activation terminal, an address input terminal, a row selection part, a column selection part, an analog-to-digital converter part and a shift register part. The activation terminal is configured to receive an activation maintenance signal to activate the driver. The address input terminal is configured to receive an input address. The row selection part is electrically connected to the address input terminal, and comprises a plurality of row input lines configured to connect to common terminals of the plurality of LEDs, respectively. The column selection part is electrically connected to the address input terminal, and comprises a plurality of column input lines configured to connect to sensing terminals of the plurality of LEDs, respectively, and apply a constant current to the column input line corresponding to the input address, so as to forwardly conduct the LED corresponding to the input address to output an output voltage at the sensing terminal of the LED corresponding to the input address. The analog-to-digital converter part is electrically connected to the column input lines for receiving the output voltage, and configured to convert the output voltage into a digital output voltage. The shift register part is electrically connected to the analog-to-digital converter part, and configured to output the digital output voltage with a serial transmission format, to a load component, so that the digital output voltage with the serial transmission format is output at an output terminal of the load component.

Preferably, the driver comprises a clock terminal configured to receive a pulse signal to timingly activate the driver.

Preferably, the driver comprises a memory part electrically connected to the analog-to-digital converter part and configured to store the digital output voltage.

Preferably, the analog-to-digital converter part comprises a reference terminal configured to receive a reference voltage, and the analog-to-digital converter part converts the output voltage into a relative digital voltage according to the reference voltage.

Preferably, the driver is on disposed an emission side or a back side of the LED array.

Preferably, a substrate of each of the plurality of LEDs is glass substrate.

According to an embodiment, the present invention provides a display panel sensing system comprising a plurality of LED arrays and a plurality of drivers. The plurality of LED arrays forms a display panel, and each of the plurality of LED arrays comprises at least two LEDs. The drivers are disposed correspondingly to the plurality of LED arrays, respectively. Each of the plurality of LED arrays comprises one of the plurality of drivers and at least two LEDs of each of the plurality of LED arrays are arranged around the corresponding driver as a center and electrically connected to the corresponding driver. Each driver comprises an address input terminal, an activation terminal, a row selection part, a column selection part, an analog-to-digital converter part, and a shift register part. The address input terminal is configured to receive an input address. The activation terminal is configured to receive an activation maintenance signal to activate the driver. The row selection part is electrically connected to the address input terminal, and comprises a plurality of row input lines configured to electrically connect to common terminals of the at least two LEDs, respectively. The column selection part is electrically connected to the address input terminal, and comprises a plurality of column input lines configured to electrically connect to sensing terminals of at least two LEDs, respectively, and apply a constant current to the column input line corresponding to the input address, so as to forwardly conduct the LED corresponding to the input address, to generate an output voltage at the sensing terminal of the LED corresponding to the input address, thereby outputting the output voltage to the column selection part. The analog-to-digital converter part is electrically connected to the column input lines for receiving the output voltage and configured to convert the output voltage into a digital output voltage. The shift register part is electrically connected to the analog-to-digital converter part, and configured to output the digital output voltage with a serial transmission format, to a load component, so that the digital output voltage with the serial transmission format is output at an output terminal of the load component.

Preferably, each of the activation terminals receives the activation maintenance signals to activate the plurality of drivers, respectively.

Preferably, each of the plurality of drivers comprises a clock terminal configured to receive a pulse signal to timingly activate the driver.

Preferably, each of the plurality of drivers comprises a memory part electrically connected to the analog-to-digital converter part and configured to store the digital output voltage.

Preferably, each of the plurality of analog-to-digital converter parts comprises a reference terminal configured to receive a reference voltage and converts the output voltage into the relative digital voltage according to the reference voltage.

Preferably, each of the plurality of drivers is disposed at an emission side or a back side of one of the plurality of LED arrays corresponding thereto.

Preferably, a substrate of each of the at least two LEDs of one of the plurality of LED arrays is glass substrate.

Preferably, a sensing time of the display panel is the time after assembly of the display panel or a blank time of the display panel.

According to above contents, the LED sensing system and the display panel sensing system of the present invention have at least one of the following advantages.

First, the driver can be disposed at the central portion of the LED array, so the driver can inspect each LED with the same speed, so as to reduce sensing errors.

Secondly, the memory part can store the digital output voltage of the LEDs, so as to find the first voltage suitable for each LED for optimization of the brightness of each LED.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

Figure 1:
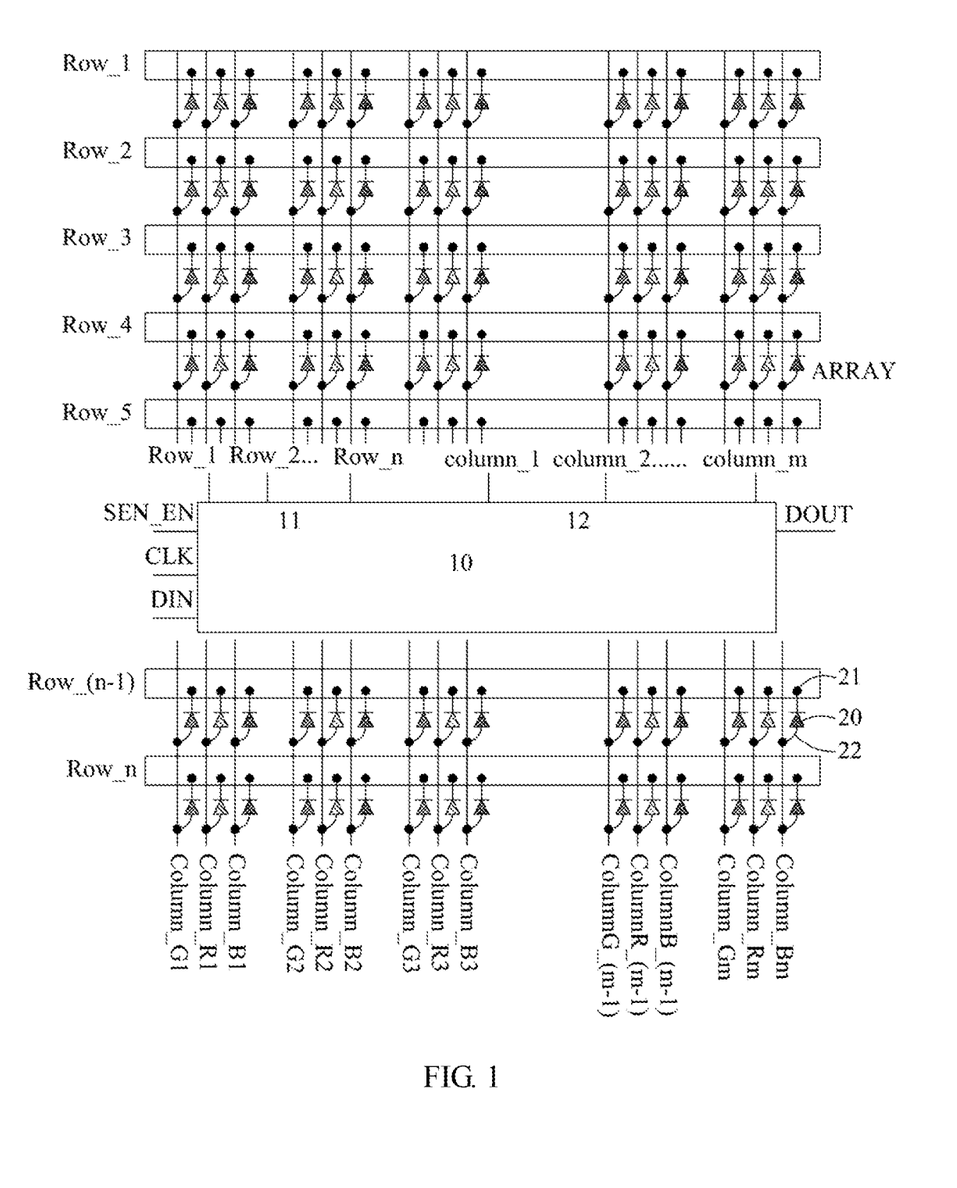
FIG. 1 is a configuration view of a LED sensing system of a first embodiment of the present invention.
Figure 2:
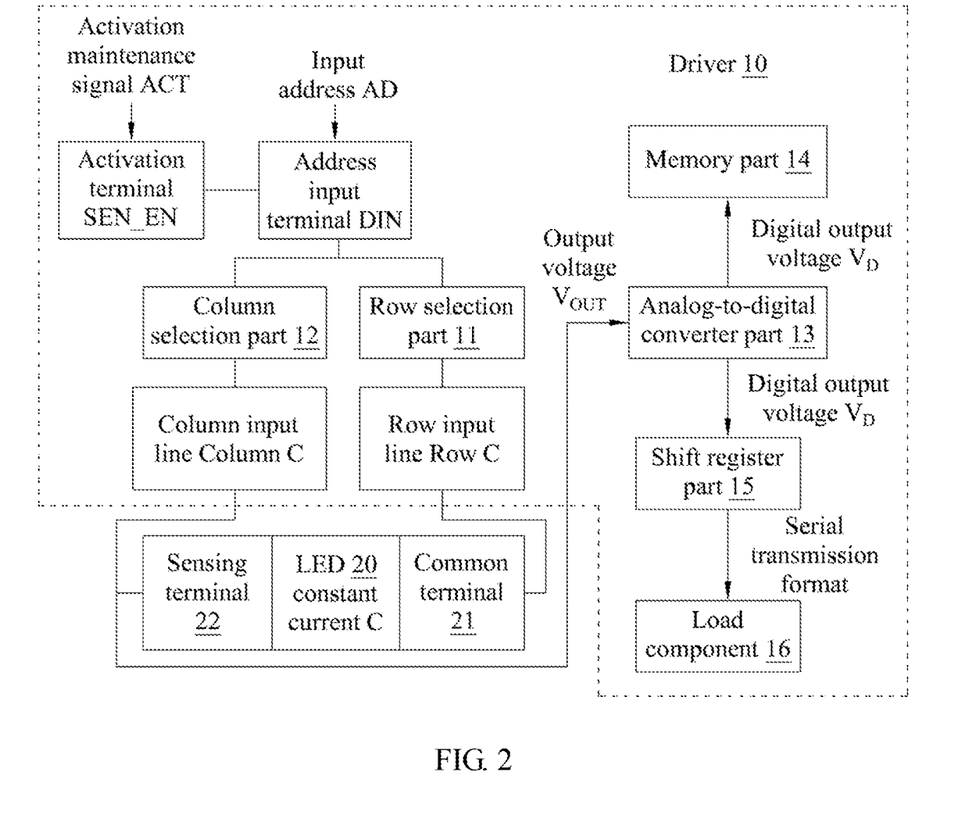
FIG. 2 is a block diagram of operation of inspecting the LED corresponding to input address, according to a LED sensing system of a first embodiment of the present invention.
Figure 3:
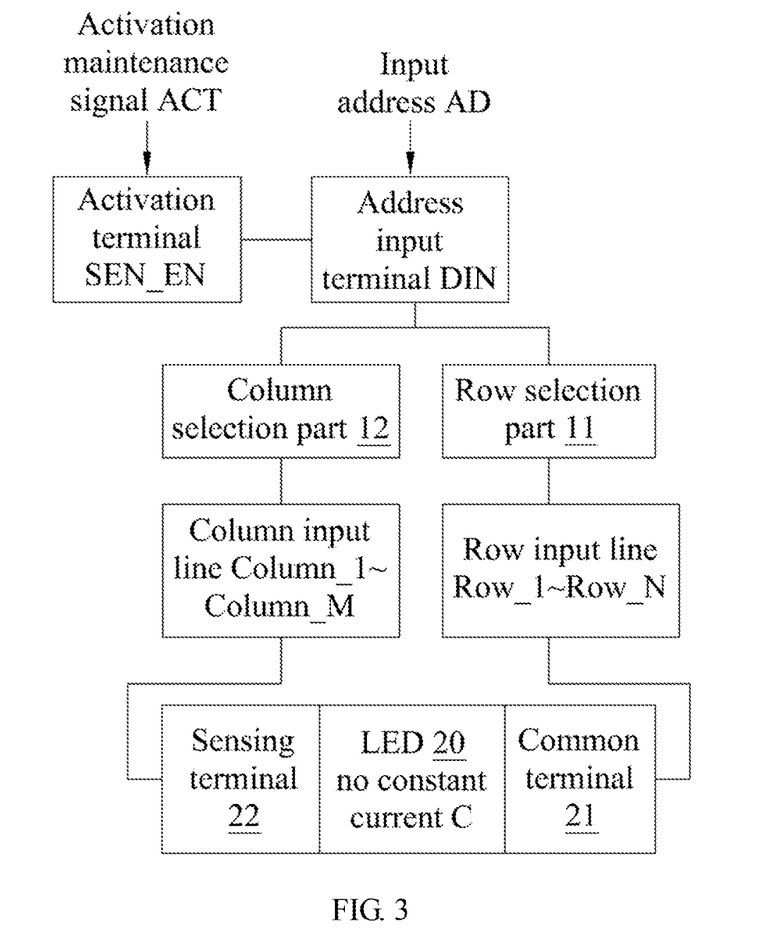
FIG. 3 is a block diagram of the LEDs other than the LED shown in FIG. 2, according to a LED sensing system of a first embodiment of the present invention.

Please refer to FIGS. 1, 2 and 3, which are configuration view of a LED sensing system, a block diagram of operation of inspecting the LED corresponding to the input address of a LED sensing system, and a block diagram of the LEDs other than the LED of FIG. 2 of a LED sensing system, according to a first embodiment of the present invention. In this embodiment, the present invention provides a LED sensing system comprising a plurality of LEDs 20 and a driver 10. The plurality of LEDs 20 are arranged in a LED array ARRAY by an array form, and the substrate of each LED 20 can be the glass substrate. The driver 10 is disposed on a central portion of the LED array ARRAY, and electrically connected a plurality of LEDs 20 and disposed on an emission side or a back side of the LED array ARRAY. The driver 10 can comprise an activation terminal SEN_EN, an address input terminal DIN, a clock terminal CLK, a row selection part 11, a column selection part 12, an analog-to-digital converter part 13 and a shift register part 15. The activation terminal SEN_EN is configured to receive an activation maintenance signal ACT and activate the driver 10 according to the activation maintenance signal ACT. The address input terminal DIN is configured to receive an input address AD, the clock terminal CLK is configured to receive a pulse signal, so as to timingly turn on the driver 10. The row selection part 11 is electrically connected to the address input terminal DIN, and comprises a plurality of row input lines Row_1 to Row_N electrically connected to the common terminals 21 of the LEDs 20, respectively. The column selection part 12 is electrically connected to the address input terminal DIN, and comprises a plurality of column input lines Column_1 to Column_m electrically connected to the sensing terminals 22 of the LEDs 20, respectively. The column input lines Column_1 to Column_m comprise red lines Column_R1 to Column_Rm, blue lines Column_B1 to Column_Bm and green lines Column_G1 to Column_Gm, respectively. The analog-to-digital converter part 13 is electrically connected to the column input lines Column_1 to Column_m, and the shift register part 15 is electrically connected to the analog-to-digital converter part 13. Furthermore, the driver 10 can include a memory part 14 electrically connected to the analog-to-digital converter part 13. The driver 10 is disposed on the central portion of the LED array ARRAY, so the driver 10 can inspect the LED 20 with the same speed, so as to reduce possibility of occurrence of sensing error. The number of the LED 20 controlled by the driver 10 can be adjusted according to the engineer's requirements, and the number of the LED 20 being controlled in the present is not limited to above examples.

The operation of inspecting the LED 20 corresponding to the input address AD is described with reference to FIGS. 1, 2 and 3. First, according to the input address AD, the row selection part 11 and the column selection part 12 select the column input line Column_C and the row input line Row_C corresponding to the input address AD, and a constant current C is applied to the column input line Column_C corresponding to the input address AD, so as to forwardly conduct and turn on the LED 20 corresponding to the input address AD, and the other LEDs 20 are turned off because of no constant current C. An output voltage $V_{OUT}$ is output at the sensing terminal 22 of the LED 20 corresponding to the input address AD, and the output voltage $V_{OUT}$ is then generated to the analog-to-digital converter part 13. Thirdly, the analog-to-digital converter part 13 converts the output voltage $V_{OUT}$ into the digital output voltage $V_D$, and also transmits the output voltage $V_{OUT}$ to the memory part 14 and the shift register part 15. The memory part 14 stores the digital output voltages $V_D$. According to the digital output voltages $V_D$ of the LEDs stored the memory part 14, the constant current C applied to each LED can be adjusted appropriately to optimize the brightness of each LED. The shift register part 15 outputs the digital output voltage VD with serial transmission format to a load component 16, so as to output the digital output voltage VD with serial transmission format at an output terminal DOUT of the load component 16. By selecting the column input line Column_C and the row input line Row_C corresponding to the input address AD, the LED 20 corresponding to the input address AD can enter in the forward-biased state, so that the user can determine whether the to-be-sensed LED 20 is good LED, according to the light-emitting degree of the LED 20 corresponding to the input address AD.

Figure 4:
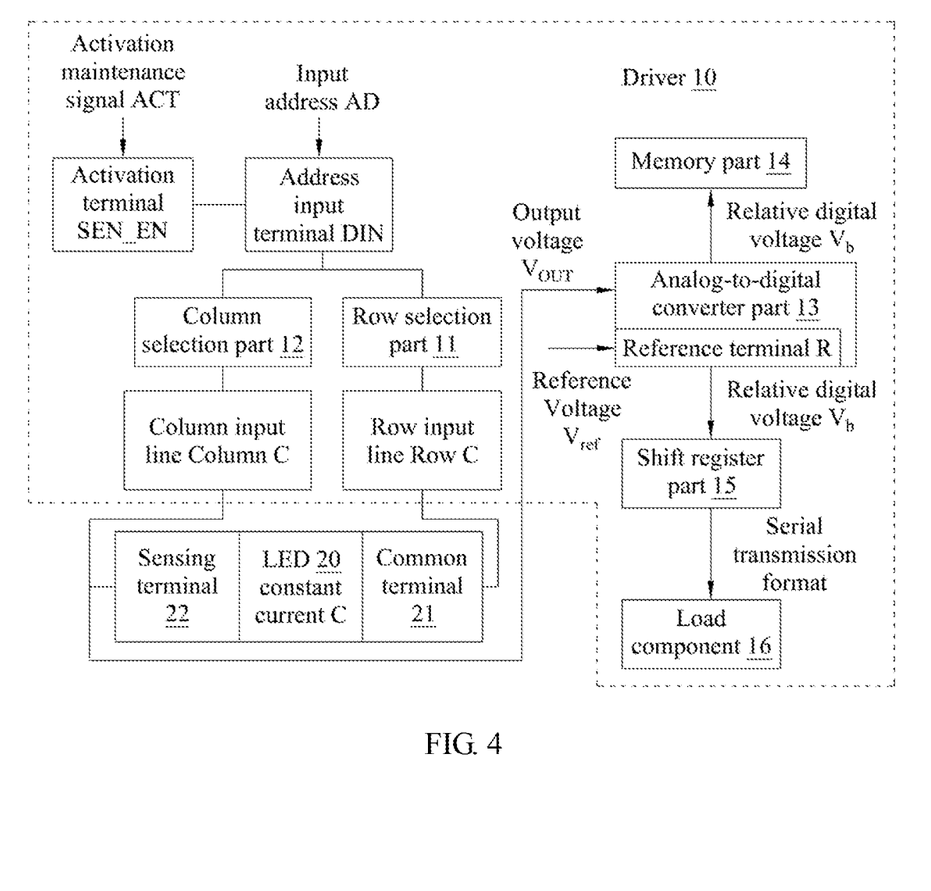
FIG. 4 is a block diagram of operation of inspecting the LED corresponding to input address, according to a LED sensing system of a second embodiment of the present invention.

Please refer to FIG. 4, which is block diagrams of operation of inspecting the LED corresponding to the input address. In this embodiment, like reference numerals designate like structures, elements, or parts throughout the specification, so the detailed descriptions are not repeated herein.

Besides, the input address AD may be a binary format, the source of the input address AD may be a header, a row selection unit and a column selection of the driver 10.

Figure 5:
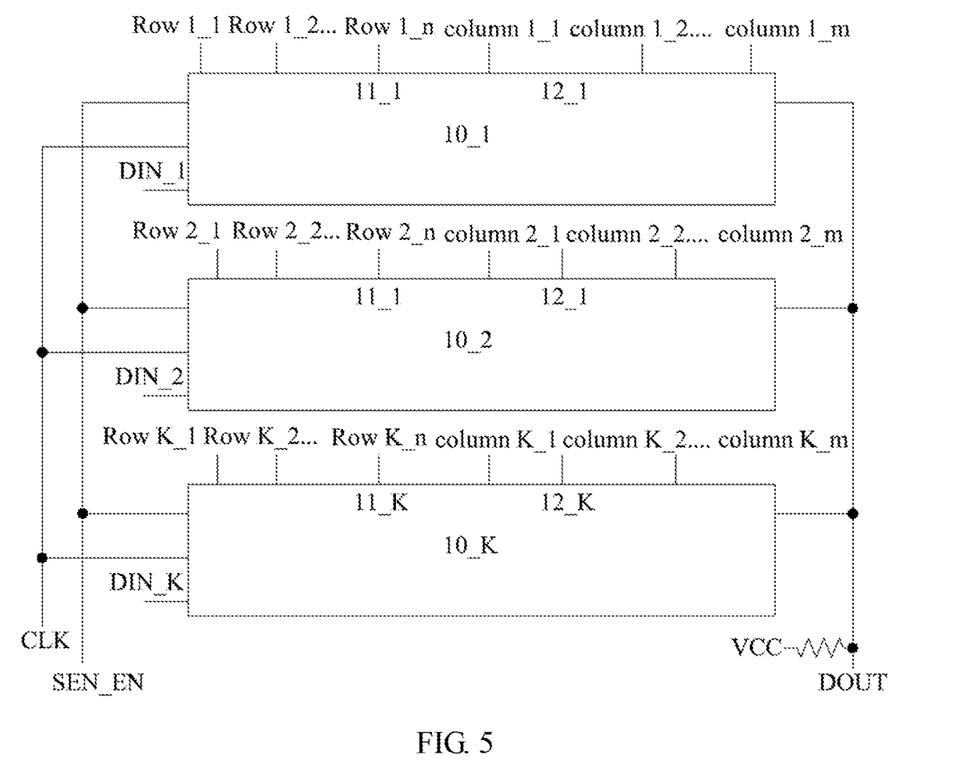
FIG. 5 is a configuration view of a display panel sensing system of a first embodiment of the present invention.

As shown in FIGS. 4 and 5, the analog-to-digital converter part 13 comprises a reference terminal R configured to receive a reference voltage Vref. The analog-to-digital converter part 13 can convert the output voltage $V_{OUT}$ into the relative digital voltage Vb according to the reference voltage Vref Specifically, according to the reference voltage $V_{ref}$, the analog-to-digital converter part 13 can convert the output voltage $V_{OUT}$ into the relative digital voltage Vb, the reference voltage $V_{ref}$ can be set according to engineer sensing standard, so as to know the condition of the LED 20 corresponding to the input address $A_D$ and determine whether the LED 20 corresponding to the input address $A_D$ should be adjusted. The relative digital voltage Vb is transmitted to the memory part 14 the shift register part 15. The memory part 14 stores the relative digital voltage Vb, and according to the relative digital voltages Vb of the LEDs stored in the memory part 14, the constant current C for each LED 20 can be properly adjusted for optimizing the brightness of each LED. The shift register part 15 can output the digital output voltage $V_D$ with the serial transmission format to the load component 16, so that the digital output voltage $V_D$ with the serial transmission format can be output at an output terminal $D_{OUT}$ of the load component 16, comprise the output voltage $V_{OUT}$ of the serial transmission format. Preferably, the load component 16 can be a transistor, a resistor or a MOSFET; however, the present invention is not limited thereto.

Figure 6:
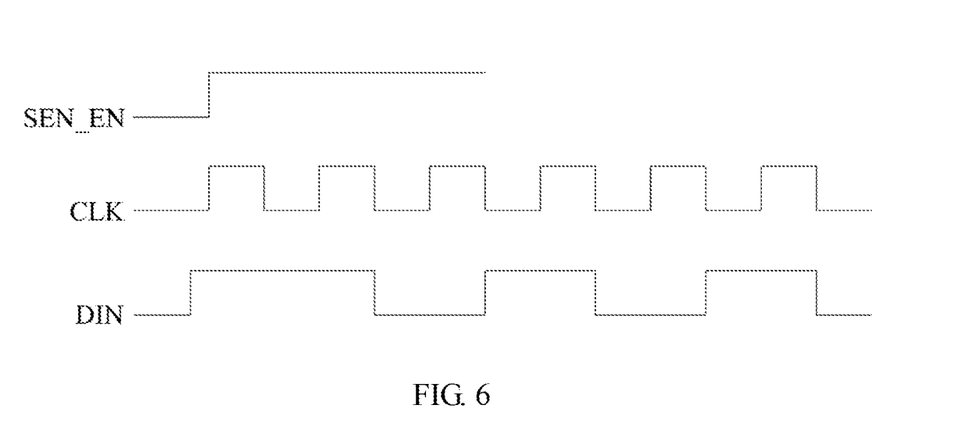
FIG. 6 is a signal diagram of a display panel sensing system of a first embodiment of the present invention.

Please refer to FIGS. 5 and 6, which are configuration view and signal diagram of the display panel sensing system of a first embodiment of the present invention. In this embodiment, the present invention can provide a display panel sensing system comprising a plurality of LED arrays ARRAY_1 to ARRAY_K and a plurality of drivers 10_1 to 10_K. It should be noted that the labels 10_1 to 10_K for the drivers are merely for distinguishing the drivers from each other, and the labels ARRAY_1 to ARRAY_K for the LED arrays are merely for distinguishing the LED arrays from each other. The plurality of LED arrays ARRAY_1 to ARRAY_K can form the display panel, and each of the plurality of LED arrays ARRAY_1 to ARRAY_K comprises at least two LED 20. The substrate of the LED 20 of the LED array ARRAY_1 to ARRAY_K can be the glass substrate. The plurality of drivers 10_1 to 10_K are disposed correspondingly to the plurality of LED arrays ARRAY_1 to ARRAY_K, respectively. The number of the plurality of drivers 10_1 to 10_K is the same as the number of the plurality of LED arrays ARRAY_1 to ARRAY_K. Each of the LED arrays ARRAY_1 to ARRAY_K can comprise one of the drivers 10_1 to 10_K corresponding thereto. In one of the LED array ARRAY_1 to ARRAY_K, the LEDs 20 thereof are disposed around and electrically connected to one of the drivers 10_1 to 10_K corresponding thereto and as a central portion. Each of the drivers 10_1 to 10_K comprises the activation terminal SEN_EN, one of the address input terminals DIN_1 to DIN_K corresponding thereto, the clock terminal CLK, one of the row selection parts 11_1 to 11_K corresponding thereto, one of the column selection parts 12_1 to 12_K corresponding thereto, the analog-to-digital converter part 13 and the shift register part 15. The activation terminals SEN_EN are electrically connected to each other, the clock terminals CLK are electrically connected to each other, the analog-to-digital converter parts 13 have the same configurations, and the shift register parts 15 have the same configurations. According to the input address AD, each activation terminal SEN_EN can receive the activation maintenance signal ACT to activate one of the corresponding drivers 10_1 to 10_K corresponding thereto. The address input terminals DIN_1 to DIN_K are configured to receive the input addresses AD, respectively. The clock terminals CLK are configured to receive the pulse signal to timingly activate the driver 10. The row selection parts 11_1 to 11_K are electrically connected to the address input terminals DIN_1 to DIN_K, respectively, and the row selection part 11_1 comprises the plurality of row input lines Row1_1 to Row1_n, the row selection part 11_2 comprises row input lines Row2_1 to Row2_n, and the row selection part 11_K comprises row input lines RowK_1 to RowK_n, and so on. The row input lines of the row selection parts 11_1 to 11_K are electrically connected to the common terminals 21 of the LEDs 20 of the LED array ARRAY_1 to ARRAY_K, respectively. Each of the column selection parts 12_1 to 12_K is electrically connected to the address input terminal DIN corresponding thereto, and the column selection part 12_1 comprise the column input lines Column1_1 to ColumnM1_m, the column selection part 12_2 comprises the column input lines Column2_1 to ColumnM2_m, the column selection part 12_K comprises the column input lines ColumnK_1 to ColumnK_m, and so on; and, the column input lines of the column selection parts 12_1 to 12_K are electrically connected to the sensing terminals 22 of the LEDs 20 of the LED arrays ARRAY_1 to ARRAY_K, respectively. The analog-to-digital converter parts 13 are electrically connected to each column input line lines Column1_1 to ColumnM1_m respectively, and each analog-to-digital converter part 13 comprises the reference terminal R configured to receive the reference voltage $V_{ref}$. Each shift register part 15 is electrically connected to the analog-to-digital converter part 13 corresponding thereto. Furthermore, each of the drivers 10_1 to 10_K can comprise the memory part 14 electrically connected to the analog-to-digital converter part 13. The plurality of LED arrays ARRAY_1 to ARRAY_K of the display panel can be grouped according to configuration of the drivers 10_1 to 10_K. in order to inspect the display panel, the user just need to drive one of the drivers 10_1 to 10_K first to drive the LEDs 20 corresponding thereto without inspecting overall LEDs of the display panel at the same time, so as to increase the inspecting speed for the LEDs. Preferably, the sensing time of the display panel can be the time after assembly of the display panel, or the sensing time can be the blank time of the display panel, that is, the switching time between image frame. As a result, the performance of the display panel can be inspected in real time. It is to be noted that the number of the plurality of drivers 10_1 to 10_K can be determined according to the practical demand of inspecting the display panel, so as to group the LED 20 of the display panel into multiple zones. The number of the drivers 10_1 to 10_K of the present invention is not limited to above example, and each of the plurality of drivers 10_1 to 10_K can be disposed at the emission side or the back side of one of the plurality of LED arrays ARRAY_1 to ARRAY_K corresponding thereto, but the drivers 10_1 to 10_K must be disposed on the same side, for example, the drivers 10_1 to 10_K all are disposed on the back sides of the LED arrays ARRAY_1 to ARRAY_K.

Furthermore, in order to drive one of the plurality of drivers 10_1 to 10_K, the input address AD has an additional bit to determine which driver to be driven, for example, when the input address is 1110110, the first bit "1" means to drive the first driver, and "110110" means to drive the LED 20 at the sixth row and sixth column.

The configuration of each of the drivers 10_1 to 10_K is the same as that of the driver shown in FIG. 1, so the operation of driving single driver 10_K is described to illustrate the operation of the display panel sensing system with reference to FIGS. 1, 2, 3 and 7. First, when the activation terminal SEN_EN activates, according to the input address AD, the driver 10_K, the driver 10_K receives the pulse signal of the clock terminal CLK to operate periodically. According to the input address AD, the row selection part 11_K and the column selection part 12_K select the column input line Column_C and the row input line Row_C corresponding to the input address AD, and a constant current C is applied to the column input line Column_C corresponding to the input address AD, so as to forwardly conduct and turn on the LED 20 corresponding to the input address AD, and the other LEDs 20 are turned off because of no constant current C. The output voltage VOUT can be generated at the sensing terminal 22 of the LED 20 corresponding to the input address AD. Thirdly, the analog-to-digital converter part 13 converts the output voltage $V_{OUT}$ into the digital output voltage $V_D$, and transmits the digital output voltage $V_D$ to the memory part 14 and the shift register part 15. The memory part 14 stores the digital output voltage $V_D$, and according to the digital output voltages VD of the LEDs stored in the memory part 14, the constant current C for each LED can be appropriately adjusted for optimizing the brightness of each LED. The shift register part 15 outputs the digital output voltage $V_D$ with the serial transmission format to the load component 16, so that the digital output voltage $V_D$ with the serial transmission format can be output at the output terminal DOUT of the load component 16. According to above-mentioned mechanism, the sensing flow for each of the LED arrays ARRAY_1 to ARRAY_K of the display panel can be simplified without electrically connecting all LEDs 20 of all LED arrays ARRAY_1 to ARRAY_K, to, so as to improve the sensing efficiency. The operations of inspecting the other LED arrays ARRAY_1 to ARRAY_K and drivers 10_1 to 10_K are the same as the above example, so their descriptions are not repeated herein.

Furthermore, the analog-to-digital converter part 13 can convert the output voltage Van into the relative digital voltage Vb according to the reference voltage $V_{ref}$, and the reference voltage $V_{ref}$ can be set according to engineer sensing standard. The difference between the relative digital voltage Vb and the reference voltage $V_{ref}$ can be used to determine the operational condition of the inspected LED 20, so that the brightness of the LED 20 can be appropriately adjusted according to the difference between the relative digital voltage Vb and the reference voltage Vref.

In summary, in the LED sensing system of the present invention, the driver 10 is disposed at the central portion of the LED array ARRAY, so the driver 10 can inspect each LED 20 with the same speed substantially, thereby reducing the sensing errors; furthermore, with configuration of the drivers 10_1 to 10_K and the LED array ARRAY_1 to ARRAY_K, the LEDs of the display panel of the present invention can be grouped effectively for accelerating the sensing process for the LEDs. As a result, the LED sensing system and the display panel sensing system of the present invention have aforementioned advantages, so as to reduce errors occurred in the sensing process of the LEDs 20.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A light emitting diode (LED) sensing system, comprising:
   a plurality of LEDs arranged in an LED array by an array form;
   an LED driver disposed at a central portion of the LED array and electrically connected to the plurality of LEDs, respectively, and the LED driver comprising:
   an activation terminal configured to receive an activation maintenance signal to activate the LED driver;
   an address input terminal configured to receive an input address;
   a row selection circuit electrically connected to the address input terminal, and comprising a plurality of row input lines configured to electrically connect to common terminals of the plurality of LEDs, respectively;

a column selection circuit electrically connected to the address input terminal, and comprising a plurality of column input lines configured to electrically connect to sensing terminals of the plurality of LEDs, respectively, and apply a constant current to the column input line corresponding to the input address, so as to forwardly conduct the LED corresponding to the input address to output an output voltage at the sensing terminal of the LED corresponding to the input address;

an analog-to-digital converter part electrically connected to each of the sensing terminal of the LED for receiving the output voltage, and configured to convert the output voltage into a digital output voltage; and a shift register part electrically connected to the analog-to-digital converter part, and configured to output the digital output voltage with a serial transmission format to a load component, so that the digital output voltage with the serial transmission format is output at an output terminal of the load component.

2. The LED sensing system according to claim 1, wherein the LED driver comprises a clock terminal configured to receive a pulse signal to timingly activate the LED driver.

3. The LED sensing system according to claim 1, wherein the LED driver comprises a memory part electrically connected to the analog-to-digital converter part and configured to store the digital output voltage.

4. The LED sensing system according to claim 1, wherein the analog-to-digital converter part comprises a reference terminal configured to receive a reference voltage, and the analog-to-digital converter part converts the output voltage into a relative digital voltage according to the reference voltage.

5. The LED sensing system according to claim 1, wherein the LED driver is disposed on an emission side or a back side of the LED array.

6. The LED sensing system according to claim 1, wherein a substrate of each of the plurality of LEDs is glass substrate.

7. A display panel sensing system, comprising:

a plurality of light emitting diode (LED) arrays configured to form a display panel, wherein each of the plurality of LED arrays comprises at least two LEDs;

a plurality of LED drivers disposed correspondingly to the plurality of LED arrays, respectively, wherein each of the plurality of LED arrays comprises one of the plurality of LED drivers and the at least two LEDs of each of the plurality of LED arrays are arranged around the corresponding LED driver as a center and electrically connected to the corresponding LED driver, and each of the plurality of LED drivers comprises:

an address input terminal configured to receive an input address;

an activation terminal configured to receive an activation maintenance signal to activate the LED driver;

a row selection circuit electrically connected to the address input terminal, and comprising a plurality of row input lines configured to electrically connect to common terminals of the at least two LEDs, respectively;

a column selection circuit electrically connected to the address input terminal, and comprising a plurality of column input lines configured to electrically connect to sensing terminals of the at least two LEDs, respectively, and apply a constant current to the column input line corresponding to the input address and does not apply the constant current to the other LEDs, so as to forwardly conduct the LED corresponding to the input address, to output an output voltage at the sensing terminal of the LED corresponding to the input address, thereby outputting the output voltage to the row selection circuit;

an analog-to-digital converter part electrically connected to each of the sensing terminal of the LED for receiving the output voltage, and configured to convert the output voltage into a digital output voltage; and a shift register part electrically connected to the analog-to-digital converter part, and configured to output the digital output voltage with a serial transmission format, to a load component, so that the digital output voltage with the serial transmission format is output at an output terminal of the load component.

8. The display panel sensing system according to claim 7, wherein the activation terminals receive the activation maintenance signals to activate the plurality of LED drivers, respectively.

9. The display panel sensing system according to claim 7, wherein each of the plurality of LED drivers comprises a clock terminal configured to receive a pulse signal to timingly activate the LED driver.

10. The display panel sensing system according to claim 7, wherein each of the plurality of LED drivers comprises a memory part electrically connected to the analog-to-digital converter part and configured to store the digital output voltage.

11. The display panel sensing system according to claim 7, wherein each of the plurality of analog-to-digital converter parts comprises a reference terminal configured to receive a reference voltage and converts the output voltage into the relative digital voltage according to the reference voltage.

12. The display panel sensing system according to claim 7, wherein the plurality of LED drivers are disposed at emission sides or back sides of the plurality of LED arrays corresponding thereto.

13. The display panel sensing system according to claim 7, wherein a substrate of each of the at least two LEDs of one of the plurality of LED arrays is glass substrate.

14. The display panel sensing system according to claim 7, wherein an sensing time of the display panel is a time after assembly of the display panel or a blank time of the display panel.

* * * * *